US012648488B2

(12) United States Patent
Chen et al.

(10) Patent No.: US 12,648,488 B2
(45) Date of Patent: Jun. 2, 2026

(54) SEMICONDUCTOR DEVICE

(71) Applicant: UNITED MICROELECTRONICS CORP., Hsin-Chu City (TW)

(72) Inventors: Yu-Chun Chen, Kaohsiung City (TW); Yu-Ping Wang, Hsinchu City (TW); I-Ming Tseng, Kaohsiung City (TW); Yi-An Shih, Changhua County (TW); Chung-Sung Chiang, Kaohsiung City (TW); Chiu-Jung Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 384 days.

(21) Appl. No.: 18/209,486

(22) Filed: Jun. 14, 2023

(65) Prior Publication Data

US 2024/0387418 A1 Nov. 21, 2024

(30) Foreign Application Priority Data

May 16, 2023 (TW) ................................. 112118036

(51) Int. Cl.
*H10W 90/00* (2026.01)
*H10W 20/00* (2026.01)
(Continued)

(52) U.S. Cl.
CPC ......... *H10W 90/00* (2026.01); *H10W 20/081* (2026.01); *H10W 20/42* (2026.01); *H10W 72/9232* (2026.01); *H10W 90/297* (2026.01)

(58) Field of Classification Search
CPC ............... H01L 24/05; H01L 21/76802; H01L 23/5226; H01L 25/0657; H01L 2224/05093; H01L 2225/06541; H01L 21/76898; H01L 23/481; H01L 24/80; H01L 25/50; H01L 23/485; H10W 90/00;
(Continued)

(56) References Cited

U.S. PATENT DOCUMENTS 6,995,475 B2 2/2006 Biggs
10,312,201 B1 6/2019 Hu
(Continued)

OTHER PUBLICATIONS

Chen, the specification, including the claims, and drawings in the U.S. Appl. No. 18/203,655, filed May 31, 2023.

*Primary Examiner* — Thanh T Nguyen
(74) *Attorney, Agent, or Firm* — Winston Hsu

(57) ABSTRACT

A semiconductor device includes a bottom wafer, a top wafer bonded to the bottom wafer, a first dielectric layer, a second dielectric layer, a deep via conductor structure, and a connection pad. The top wafer includes a first interconnection structure. The first dielectric layer is disposed on the top wafer. The second dielectric layer is disposed on the first dielectric layer. The deep via conductor structure penetrates through the second dielectric layer and the first dielectric layer and is connected with the first interconnection structure. The connection pad is disposed on the second dielectric layer and the deep via conductor structure. A first portion of the second dielectric layer is sandwiched between the connection pad and the first dielectric layer. A second portion of the second dielectric layer is connected with the first portion, and a thickness of the second portion is less than a thickness of the first portion.

17 Claims, 8 Drawing Sheets

(51) Int. Cl.
　　*H10W 20/42*　　　(2026.01)
　　*H10W 72/90*　　　(2026.01)
　　*H10W 90/20*　　　(2026.01)

(58) Field of Classification Search
　　CPC ............... H10W 20/081; H10W 20/42; H10W
　　　　　　72/9232; H10W 90/297; H10W 20/023;
　　　　　　H10W 20/20; H10W 99/00; H10W 20/40
　　See application file for complete search history.

(56) References Cited

U.S. PATENT DOCUMENTS

| | | | |
|---|---|---|---|
| 2021/0028218 A1* | 1/2021 | Zhang | H10F 39/024 |
| 2022/0367323 A1* | 11/2022 | Lin | H01L 21/76808 |
| 2022/0367554 A1 | 11/2022 | Li | |
| 2023/0377968 A1* | 11/2023 | Chuang | H01L 24/08 |
| 2024/0136312 A1* | 4/2024 | Verma | H01L 24/16 |

* cited by examiner

SEMICONDUCTOR DEVICE

BACKGROUND OF THE INVENTION

1. Field of the Invention

The present invention relates to a semiconductor device, and more particularly, to a semiconductor device including two wafers bonded to each other.

2. Description of the Prior Art

The technology of semiconductor integrated circuits continues to improve, and the products of each new generation process have smaller and more complex circuit designs than that of the previous generation. The number and density of functional elements on each wafer region have to be continuously increased due to product innovation requirements, and of course the geometric dimensions of each element need to be smaller and smaller. Correspondingly, in the part of integrated circuit packaging technology, a packaging technology that occupies a smaller area than that of the previous packaging technology is also required to meet product requirements. In the wafer-to-wafer bonding technology, two or more than two semiconductor wafers may constitute a 3D integrated circuit by aligning and bonding, and the number of the elements within the limited occupied area may be increased accordingly. However, there are still many problems to overcome in the wafer-to-wafer bonding technology so as to achieve commercialization and meet product requirements.

SUMMARY OF THE INVENTION

A semiconductor device is provided in the present invention. Two wafers are bonded to each other, a deep via conductor structure is used to be connected with an interconnection structure in the wafer, and signals may be transmitted from outer circuits to elements in the wafers through the deep via conductor structure accordingly.

According to an embodiment of the present invention, a semiconductor device is provided. The semiconductor device includes a bottom wafer, a top wafer, a first dielectric layer, a second dielectric layer, a deep via conductor structure, and a connection pad. The top wafer is bonded to the bottom wafer, and the top wafer includes a first interconnection structure. The first dielectric layer is disposed on the top wafer, and the second dielectric layer is disposed on the first dielectric layer. The deep via conductor structure penetrates through the second dielectric layer and the first dielectric layer, and the deep via conductor structure is connected with the first interconnection structure. The connection pad is disposed on the second dielectric layer and the deep via conductor structure. The second dielectric layer includes a first portion and a second portion. The first portion is sandwiched between the connection pad and the first dielectric layer. The second portion is connected with the first portion, and a thickness of the second portion is less than a thickness of the first portion.

According to an embodiment of the present invention, a semiconductor device is provided. The semiconductor device includes a bottom wafer, a top wafer, a first dielectric layer, and a deep via conductor structure. The top wafer is bonded to the bottom wafer, and the top wafer includes a first interconnection structure. The first dielectric layer is disposed on the top wafer; and the deep via conductor structure penetrates through the first dielectric layer. The deep via conductor structure is connected with the first interconnection structure, and the deep via conductor structure includes a first portion and a second portion. The second portion is connected with the first portion, the first portion is sandwiched between the second portion and the first interconnection structure, and a sidewall of the deep via conductor structure includes a turning section located between a sidewall of the first portion and a sidewall of the second portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-8 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Additionally, in this description, the condition that a certain component overlaps another component in a specific direction may include a condition that the certain component overlaps another component when the components are viewed in the specific direction, but not limited thereto.

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
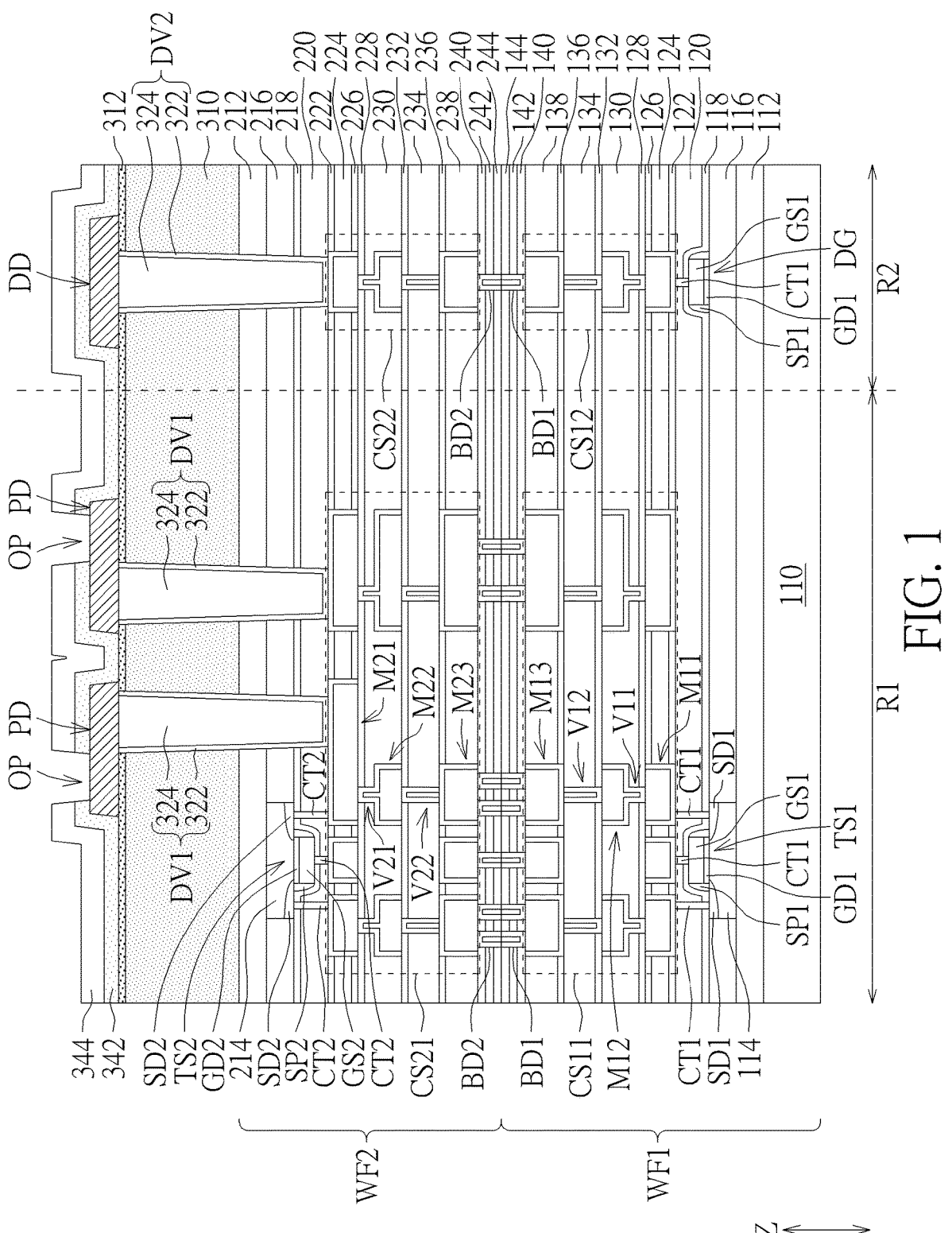
FIG. 1 is a schematic drawing illustrating a semiconductor device according to an embodiment of the present invention.
Figure 2:
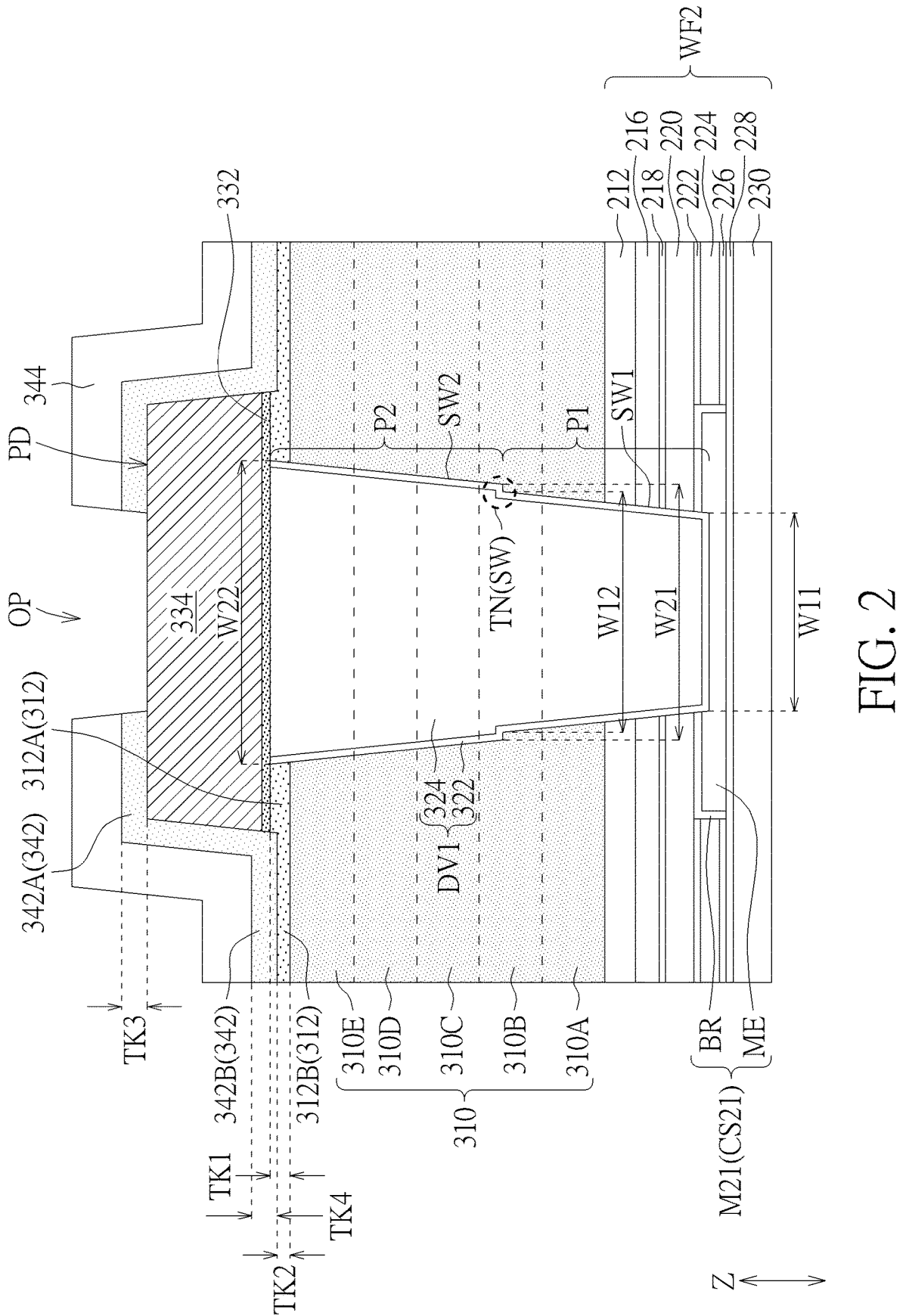
FIG. 2 is a partially enlarged schematic drawing of a semiconductor device according to an embodiment of the present invention.

Please refer to FIG. 1 and FIG. 2. FIG. 1 is a schematic drawing illustrating a semiconductor device according to an embodiment of the present invention, and FIG. 2 is a partially enlarged schematic drawing of a semiconductor device according to an embodiment of the present invention. As shown in FIG. 1 and FIG. 2, the semiconductor device in this embodiment includes a bottom wafer WF1, a top wafer WF2, a first dielectric layer 310, and a deep via conductor structure DV1. The top wafer WF2 is bonded to the bottom wafer WF1, and the top wafer WF2 includes a first interconnection structure (such as an interconnection structure CS21). The first dielectric layer 310 is disposed on the top wafer WF2, and the deep via conductor structure DV1 penetrates through the first dielectric layer 310 for being connected with the interconnection structure CS21. By the disposition of the deep via conductor structure DV1, an electrical connection path between an outer circuit and elements in the top wafer WF2 and/or the bottom wafer WF1 may be provided from the back side of the top wafer WF2 after the top wafer WF2 is bonded to the bottom wafer WF1. The negative influence of the structure connected to the outer circuit on the area occupied by the whole integrated circuit may be reduced accordingly.

In some embodiments, the semiconductor device may further include a second dielectric layer 312 and a connection pad PD. The second dielectric layer 312 is disposed on the first dielectric layer 310, and the deep via conductor structure DV1 penetrates through the second dielectric layer 312 and the first dielectric layer 310 for being connected with the interconnection structure CS21. The connection pad PD is disposed on the second dielectric layer 312 and the deep via conductor structure DV1, and the second dielectric layer 312 includes a first portion 312A and a second portion 312B. The first portion 312A is sandwiched between the connection pad PD and the first dielectric layer 310 in a vertical direction Z. The second portion 312B is connected with the first portion 312A, and a thickness TK2 of the second portion 312B is less than a thickness TK1 of the first portion 312A. In some embodiments, the deep via conductor structure DV1 includes a first portion P1 and a second portion P2. The second portion P2 is connected with the first portion P1, the first portion P1 is sandwiched between the second portion P2 and the interconnection structure CS21, and a sidewall SW of the deep via conductor structure DV1 includes a turning section TN located between a sidewall SW1 of the first portion P1 and a sidewall SW2 of the second portion P2. As shown in FIG. 1, in some embodiments, the front side of the top wafer WF2 and the front side of the bottom wafer WF1 may face each other and be bonded to each other, and the vertical direction Z may be regarded as a thickness direction of the top wafer WF2 and/or a thickness direction of the bottom wafer WF1 after the top wafer WF2 is bonded to the bottom wafer WF1. The first dielectric layer 310 may be regarded as being disposed at the back side of the top wafer WF2, and the deep via conductor structure DV1 may be regarded as a structure penetrating through material layers in the vertical direction Z and from the back side of the top wafer WF2 for being connected with the interconnection structure CS21 in the top wafer WF2. It is worth noting that in this description, a top surface and a top portion of a specific component may include the topmost surface and the topmost portion of this component in the vertical direction Z, and a bottom surface and a bottom portion of a specific component may include the bottommost surface and a bottommost portion of this component in the vertical direction Z. Additionally, in this description, the condition that a certain component is disposed between two other components in a specific direction may include a condition that the certain component is sandwiched between the two other components in the specific direction, but not limited thereto.

In some embodiments, the bottom wafer WF1 may include a substrate 110, a buried insulation layer 112, and a semiconductor layer 114. The buried insulation layer 112 is disposed on the substrate 110, the semiconductor layer 114 is disposed on the buried insulation layer 112, and the substrate 110, the buried insulation layer 112, and the semiconductor layer 114 may be regarded as a semiconductor on insulator (SOI) structure, but not limited thereto. In some embodiment, the substrate 110 may include a silicon substrate or a substrate made of other suitable materials, the buried insulation layer 112 may include an oxide insulation layer, such as a buried oxide (BOX), or other suitable insulation materials, and the semiconductor layer 114 may include a silicon-containing semiconductor layer (such as a single crystal silicon semiconductor layer) or other suitable semiconductor materials. In some embodiments, the bottom wafer WF1 and/or the top wafer WF2 may include other suitable semiconductor substrates, such as silicon substrates, silicon germanium substrates, or silicide carbide substrates, according to some design considerations. Additionally, in some embodiments, the bottom wafer WF1 may include an interlayer dielectric layer and a second interconnection structure (such as an interconnection structure CS11) disposed in the interlayer dielectric layer. The interlayer dielectric layer may include multiple material layers (such as a dielectric layer 122, a dielectric layer 124, a dielectric layer 126, a dielectric layer 128, a dielectric layer 130, a dielectric layer 132, a dielectric layer 134, a dielectric layer 136, and a dielectric layer 138) stacked in the vertical direction Z, and the interconnection structure CS11 may include electrically conductive lines (such as an electrically conductive line M11, an electrically conductive line M12, and an electrically conductive line M13) and via conductors (such as a via conductor V11 and a via conductor V12) alternately disposed in the vertical direction Z for forming the required connection path. Each dielectric layer in the interlayer dielectric layer may include an oxide dielectric material (such as silicon oxide), a nitride dielectric material (such as silicon nitride), a carbide dielectric material (such as silicon carbide), a low dielectric constant (low-k) dielectric material (such as a dielectric material having a dielectric constant lower than 2.7, but not limited thereto), or other suitable dielectric materials, and the electrically conductive line and the via conductor in the interconnection structure may include a barrier layer (such as a barrier layer BR illustrated in FIG. 2) and an electrically conductive layer (such as an electrically conductive layer ME illustrated in FIG. 2) disposed on the barrier layer. The barrier layer described above may include titanium, titanium nitride, tantalum, tantalum nitride, or other suitable barrier materials, and the electrically conductive layer described above may include materials with relatively low resistivity, such as tungsten, aluminum, copper, titanium aluminide (TiAl), cobalt tungsten phosphide (CoWP), and so forth, but not limited thereto.

In some embodiments, the bottom wafer WF1 may include active elements (such as a transistor structure TS1, but not limited thereto), passive elements, and/or other required circuit elements disposed above the substrate 110 and electrically connected with the interconnection structure CS11. For example, the bottom wafer WF1 may further include an isolation structure 116 disposed in the semiconductor layer 114 for defining an active region corresponding to the transistor structure TS1, and the transistor structure TS1 may include source/drain structures SD1 disposed in the semiconductor layer 114 and a gate dielectric layer GD1, a gate structure GS1 and a spacer SP1 disposed on the semiconductor layer 114. An etching stop layer 118 and a dielectric layer 120 may cover the transistor structure TS1, and contact structures CT1 may penetrate through the etching stop layer 118 and the dielectric layer 120 for electrically connecting the transistor structure TS1 and the interconnection structure CS11. The isolation structure 116 may include a single layer or multiple layers of insulation materials, such as an oxide insulation material and an oxynitride insulation material, the etching stop layer 118 may include a nitride insulation material or other suitable materials, and the dielectric layer 120 may include an oxide dielectric material or other suitable dielectric materials. In some embodiments, the bottom wafer WF1 may include a dielectric layer 140, a dielectric layer 142, a bonding layer 144, and bonding pads BD1 disposed on the interconnection structure CS11 and the dielectric layer 138. The dielectric layer 140, the dielectric layer 142, and the bonding layer 144 may include an oxide dielectric material, a nitride dielectric material, a carbide dielectric material (such a nitrogen-doped carbide, NDC), or other suitable materials, and the bonding pad BD1 may include a structure identical to or similar to the electrically conductive layer and the barrier layer in the interconnection structure CS11 described above, but not limited thereto.

In some embodiments, the top wafer WF2 may include a structure and/or a material composition identical to that of the bottom wafer WF1. For example, the top wafer WF2 may correspondingly include a buried insulation layer 212, a semiconductor layer 214, an isolation structure 216, a transistor structure TS2, contact structures CT2, an etching stop layer 218, a dielectric layer 220, an interlayer dielectric layer (such as a dielectric layer 222, a dielectric layer 224, a dielectric layer 226, a dielectric layer 228, a dielectric layer 230, a dielectric layer 232, a dielectric layer 234, a dielectric layer 236, and a dielectric layer 238), an interconnection structure (such as an interconnection structure CS21), a dielectric layer 240, a dielectric layer 242, a bonding layer 244, and bonding pads BD2, but not limited thereto. Similarly, the interconnection structure CS21 may include electrically conductive lines (such as an electrically conductive line M21, an electrically conductive line M22, and an electrically conductive line M23) and via conductors (such as a via conductor V21 and a via conductor V22) alternately disposed in the vertical direction Z for forming the required connection path, and the transistor structure TS2 may include source/drain structures SD2 disposed in the semiconductor layer 214 and a gate dielectric layer GD2, a gate structure GS2 and a spacer SP2 disposed on the semiconductor layer 214, but not limited thereto. The bottom wafer WF1 and the top wafer WF2 may be bonded to each other by suitable bonding approaches, and the bonding pads BD1 and the bonding pads BD2 may be bonded to one another correspondingly for forming the connection between the bottom wafer WF1 and the top wafer WF2. In some embodiments, the top wafer WF2 may include a substrate, the substrate, the buried insulation layer 212, and the semiconductor layer 214 may constitute a SOI structure, and the substrate may be removed after the bottom wafer WF1 is bonded to the top wafer WF2. Therefore, the first dielectric layer 310 may be disposed directly on the back surface of the buried insulation layer 212, but not limited thereto.

As shown in FIG. 1 and FIG. 2, in some embodiments, the deep via conductor structure DV1 may penetrate through the second dielectric layer 312, the first dielectric layer 310, and the buried insulation layer 212, the isolation structure 216, the etching stop layer 218, and the dielectric layer 220 disposed between the first dielectric layer 310 and the interconnection structure CS21 in the vertical direction Z, and the deep via conductor structure DV1 may directly contact and be electrically connected to the electrically conductive line M21 in the interconnection structure CS21 accordingly, but not limited thereto. Additionally, in some embodiments, the first dielectric layer 310 may be thicker than the second dielectric layer 312 and other material layers (such as the buried insulation layer or other dielectric layers) in the top wafer WF2 and the bottom wafer WF1, and a length of the deep via conductor structure DV1 penetrating through the first dielectric layer 310 in the vertical direction Z may be greater than a length of each via conductor of the interconnection structure in the vertical direction Z accordingly. For example, the thickness of the first dielectric layer 310 in the vertical direction Z may range from 3 micrometers to 6 micrometers, and the thickness of the second dielectric layer 312 in the vertical direction Z may range from 0.4 micrometer to 0.5 micrometer, but not limited thereto. In some embodiments, a material composition of the first dielectric layer 310 may be different from a material composition of the second dielectric layer 312 and a material composition of the buried insulation layer 212, and the second dielectric layer 312 may be used to provide protection effect to the first dielectric layer 310 in the process of forming the connection pad PD, but not limited thereto. For instance, the first dielectric layer 310 may include a nitride insulation material (such as silicon nitride), the second dielectric layer 312 may include an oxide insulation material (such as plasma enhanced oxide, PEOX), and the buried insulation layer 212 may include an oxide insulation layer, but not limited thereto.

In some embodiments, the deep via conductor structure DV1 extends mainly in the vertical direction Z without extending in horizontal directions, and the length or the width of the deep via conductor structure DV1 in the horizontal direction is obviously less than the length or the depth of the deep via conductor structure DV1 in the vertical direction Z. Additionally, in some embodiments, the connection pad PD disposed on the deep via conductor structure DV1 may be electrically connected with components in the top wafer WF2 (such as the transistor structure TS2, but not limited thereto) via the deep via conductor structure DV1 and the interconnection structure CS21. In some embodiments, the connection pad PD may be electrically connected with the interconnection structure CS11 and/or other components in the bottom wafer WF1 (such as the transistor structure TS1, but not limited thereto) via the deep via conductor structure DV1 and the interconnection structure CS21. In some embodiments, the deep via conductor structure DV1 may include a barrier layer 322 and an electrically conductive layer 324 disposed on the barrier layer 322, and the connection pad PD may include a barrier layer 332 and an electrically conductive layer 334 disposed on the barrier layer 332. The barrier layer 322 and the barrier layer 332 may include titanium, titanium nitride, tantalum, tantalum nitride, or other suitable barrier materials, and the electrically conductive layer 324 and the electrically conductive layer 334 may include materials with relatively low resistivity, such as tungsten, aluminum, copper, titanium aluminide, cobalt tungsten phosphide, and so forth, but not limited thereto. In some embodiments, the material composition of the electrically conductive layer 324 in the deep via conductor structure DV1 may be different from the material composition of the electrically conductive layer 334 in the connection pad PD. For example, the material of the electrically conductive layer 324 and the material of the electrically conductive layer 334 may be copper and aluminum, respectively, but not limited thereto.

In some embodiments, the semiconductor device may further include a third dielectric layer 342 and a dielectric layer 344, the third dielectric layer 342 may cover the connection pad PD and the second dielectric layer 312, and the dielectric layer 344 may be disposed on the third dielectric layer 342. Additionally, in some embodiments, the semiconductor device may further include an opening OP penetrating through the third dielectric layer 342 and the dielectric layer 344 located on the connection pad PD and exposing a part of the connection pad PD, and other outer circuits may contact the exposed connection pad PD for being electrically connected to the connection pad PD, but not limited thereto. In some embodiments, a material composition of the dielectric layer 344 may be different from a material composition of the third dielectric layer 342, and the material composition of the third dielectric layer 342 may be different from or identical to the material composition of the second dielectric layer 312 according to some design considerations. For example, the third dielectric layer 342 may include phosphosilicate glass (PSG), the second dielectric layer 312 may include plasma enhanced oxide, and the dielectric layer 344 may include a nitride dielectric material, but not limited thereto. In some embodiments, the third dielectric layer 342 may be substantially disposed conformally on the connection pad PD and the second dielectric layer 312, and a thickness TK3 of a first portion 342A of the third dielectric layer 342 disposed on the connection pad PD may be substantially equal to a thickness TK4 of the second portion 342B of the third dielectric layer 342 disposed on the second portion 312B of the second dielectric layer 312 accordingly, but not limited thereto. In addition, the connection pad PD overlaps the first portion 312A of the second dielectric layer 312 in the vertical direction Z, and the second portion 312B of the second dielectric layer 312 is not covered by the connection pad PD in the vertical direction Z. The second portion 312B of the second dielectric layer 312 without overlapping the connection PD in the vertical direction Z is relatively thin because of the influence of the process for forming the connection pad PD. Therefore, in some embodiments, a sum of the thickness TK1 of the first portion 312A of the second dielectric layer 312 and a thickness of the third dielectric layer 342 (such as the thickness TK3 of the first portion 342A) disposed on the connection pad PD (i.e. a sum of the thickness TK1 and the thickness TK3) may be greater than a sum of the thickness TK2 of the second portion 312B of the second dielectric layer 312 and a thickness of the third dielectric layer 342 (such as the thickness TK4 of the second portion 342B) disposed on the second dielectric layer 312 (i.e. a sum of the thickness TK2 and the thickness TK4), but not limited thereto.

As shown in FIG. 2, in some embodiments, the second portion P2 and the first portion P1 of the deep via conductor structure DV1 may be directly connected with each other, the turning section TN may be located between the sidewall SW1 of the first portion P1 and the sidewall SW2 of the second portion P2, and the turning section TN may be directly connected with the sidewall SW1 and the sidewall SW2. In other words, the sidewall SW1 of the first portion P1 and the sidewall SW2 of the second portion P2 are not disposed in the same plane, the sidewall SW1 and the sidewall SW2 are not directly connected with each other, and the sidewall SW of the deep via conductor structure DV1 may be regarded as a discontinuous sidewall accordingly, but not limited thereto. In some embodiments, the turning section TN of the sidewall SW of the deep via conductor structure DV1 may be formed because of the influence of the material of the first dielectric layer 310 and/or the manufacturing approach of the deep via conductor structure DV1, and the turning section TN may be located in the first dielectric layer 312 accordingly, but not limited thereto. For example, in some embodiments, because the integrated thickness of the first dielectric layer 310 is relatively great, a plurality of sub layers (such as a sub layer 310A, a sub layer 310B, a sub layer 310C, a sub layer 310D, and a sub layer 310E) may be formed by a film forming process with multiple sections, respectively, for controlling the thickness uniformity of the first dielectric layer 310. However, although the sub layers in the first dielectric layer 310 substantially have the same material composition, there may be still a slight difference in the material properties between the sub layers because of the influence of different film forming steps. Therefore, a ladder-shaped structure may be formed on an inner sidewall of a hole corresponding to the deep via conductor structure DV1 during the step of forming the hole, and the deep via conductor structure DV1 subsequently formed will have the turning section TN in the sidewall SW accordingly. Additionally, in some embodiments, the deep via conductor structure DV1 may be a structure with narrow bottom and wide top, and a width of the first portion P1 may be less than a width of the second portion P2 accordingly. For example, a width W11 of a bottom portion of the first portion P1 may be less than a width W12 of a top portion of the first portion P1, a width W21 of a bottom portion of the second portion P2 may be less than a width W22 of a top portion of the second portion P2, and the width W12 may be less than the width W21.

As shown in FIG. 1, in some embodiments, the semiconductor device may include a first region R1 and a second region R2. The interconnection structure CS11, the transistor structure TS1, the interconnection structure CS21, the transistor structure TS2, the deep via conductor structure DV1, and the connection pad PD described above may be disposed in the first region R1, and the semiconductor device may further include a dummy gate DG, an interconnection structure CS12, an interconnection structure CS22, a deep via conductor structure DV2, and a dummy pad DD disposed in the second region R2. In some embodiments, the dummy gate DG and the interconnection structure CS12 may be disposed in the bottom wafer WF1, the dummy gate DG may include a structure identical to or similar to the gate dielectric layer and the fate structure in the transistor TS1, and the interconnection structure CS12 may include a structure identical to or similar to the electrically conductive lines and the via conductors in the interconnection structure CS11. The interconnection structure CS22 may be disposed in the top wafer WF2, and the interconnection structure CS22 may include a structure identical to or similar to the electrically conductive lines and the via conductors in the interconnection structure CS21. The deep via conductor structure DV1 and the deep via conductor structure DV2 may have the same structure and the same material composition, and the deep via conductor structure DV2 may penetrate through the second dielectric layer 312, the first dielectric layer 310, and the buried insulation layer 212, the isolation structure 216, the etching stop layer 218, and the dielectric layer 220 located between the first dielectric layer 310 and the interconnection structure CS22 for directly contacting and being electrically connected to the interconnection structure CS22. The dummy pad DD and the connection pad PD may have the same structure and the same material composition, the dummy pad DD may be connected with the deep via conductor structure DV2, and the dummy pad DD may be covered by the third dielectric layer 342 and the dielectric layer 344. In some embodiments, the dummy pad DD, the deep via conductor structure DV2, the interconnection structure CS22, the bonding pad BD2, the bonding pad BD1, the interconnection structure CS12, the contact structure CT1, and the dummy gate DG located in the second region R2 may be connected with one another for constituting a die seal ring, the second region R2 may be regarded as a die seal ring region, and the first region R1 may be regarded as a chip region, but not limited thereto.

Figure 3:
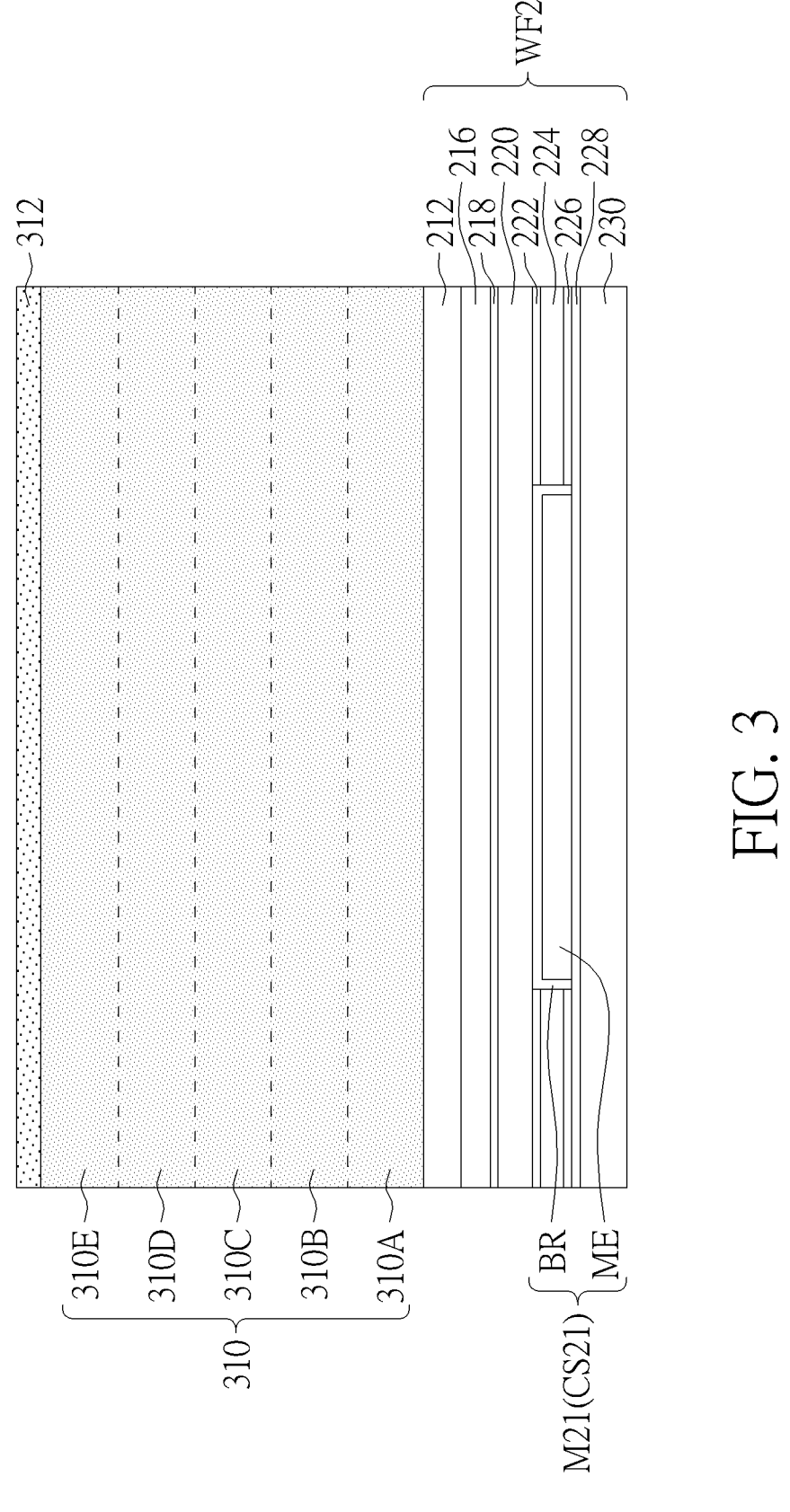
Figure 4:
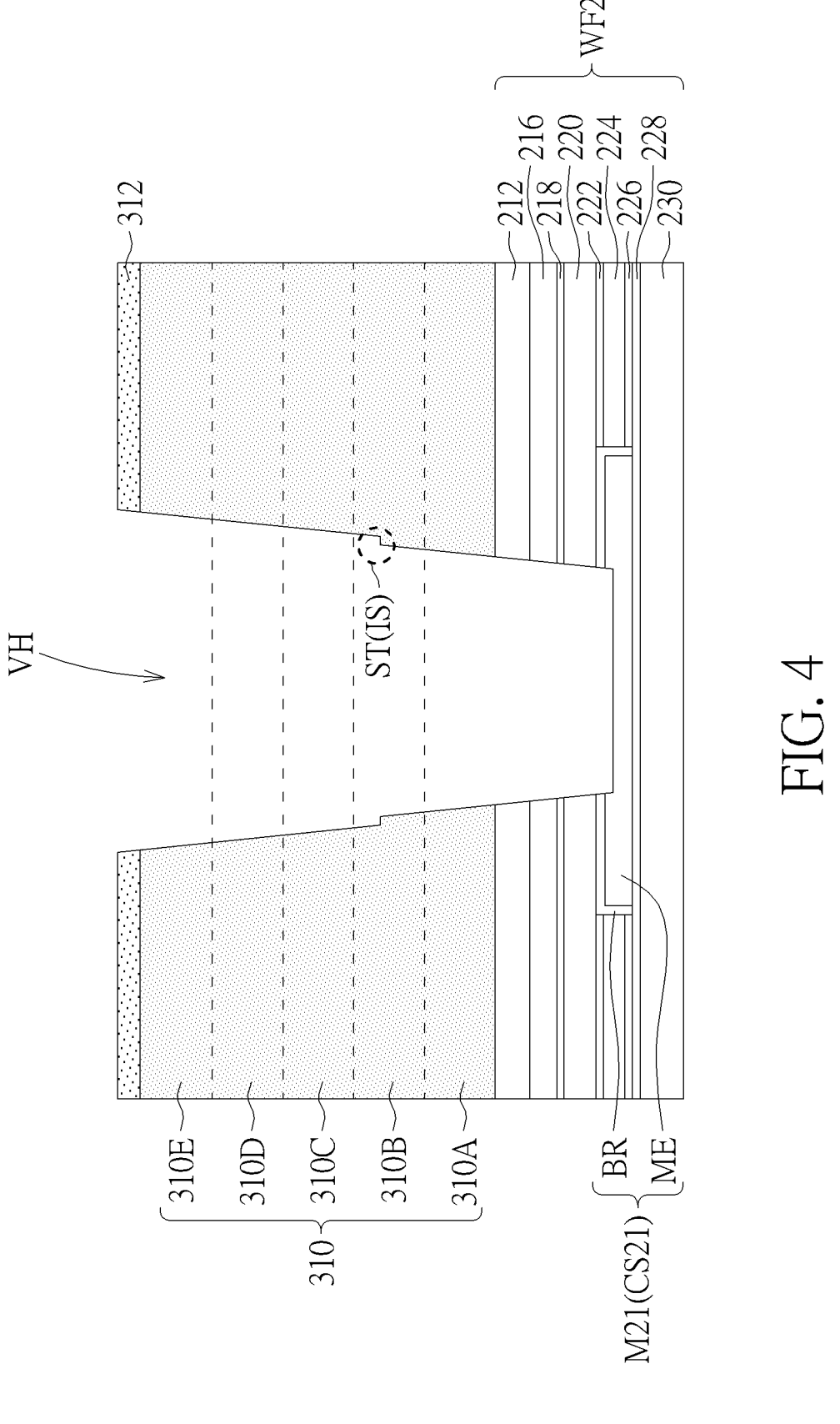
Figure 5:
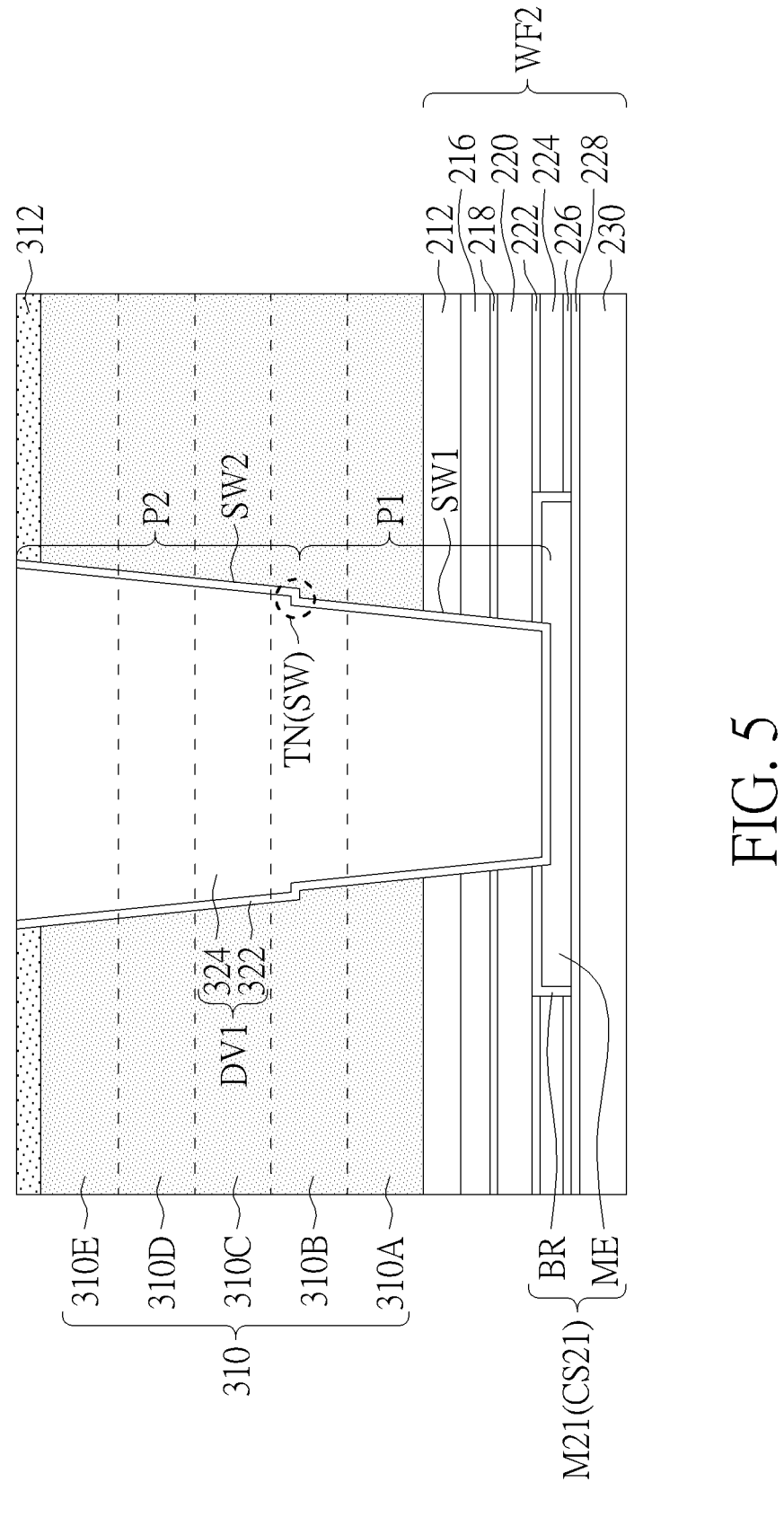
Figure 6:
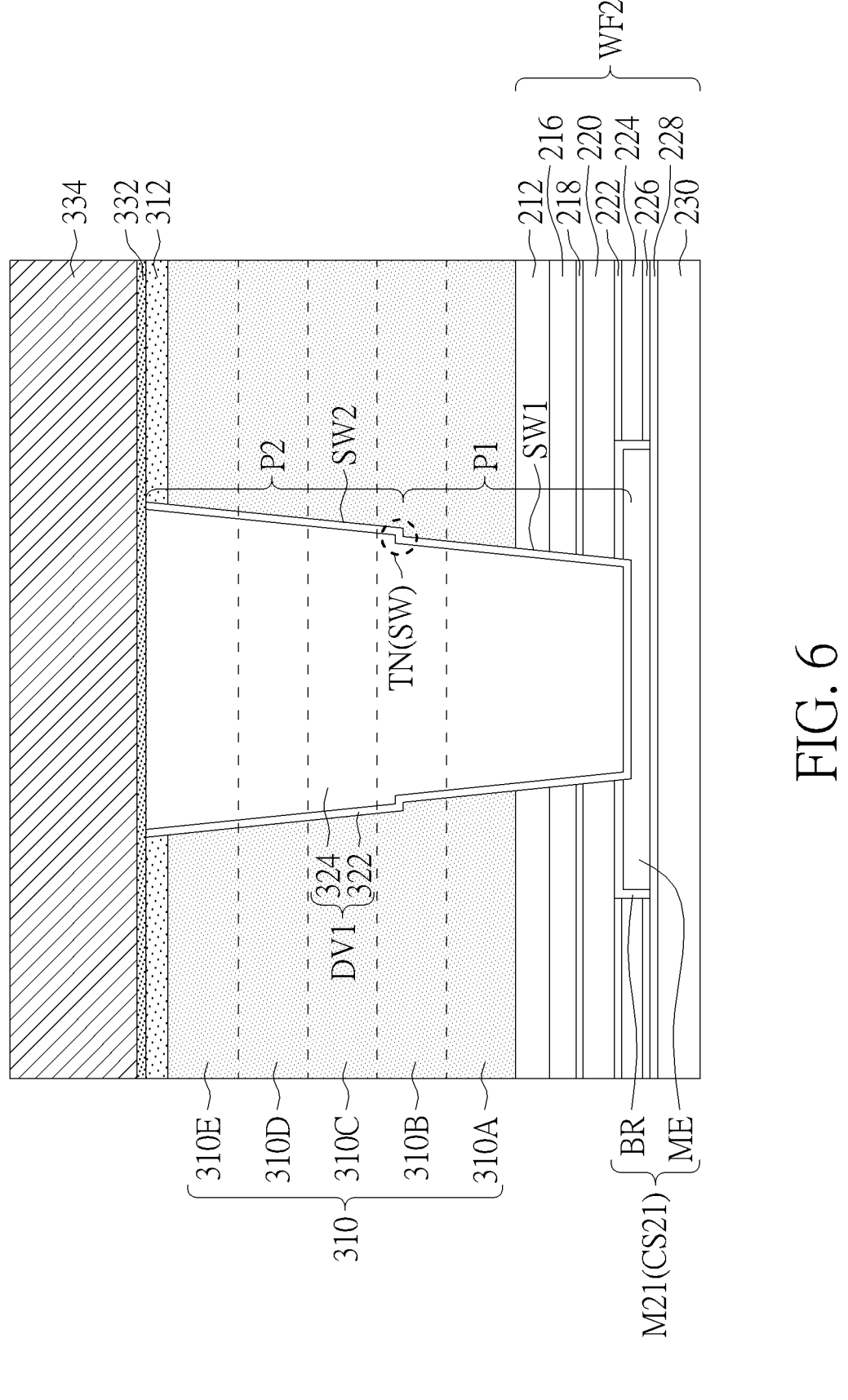
Figure 7:
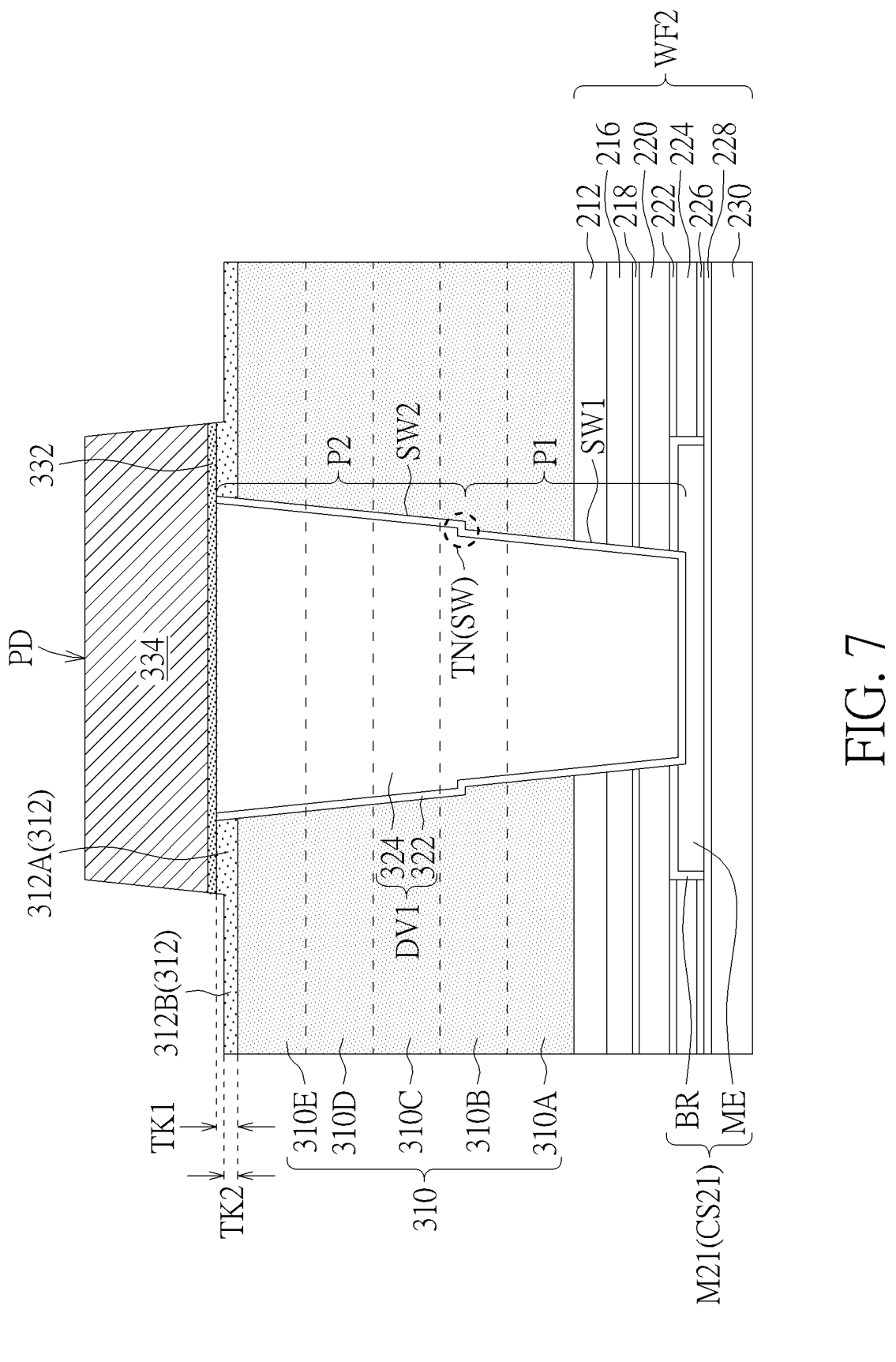
Figure 8:
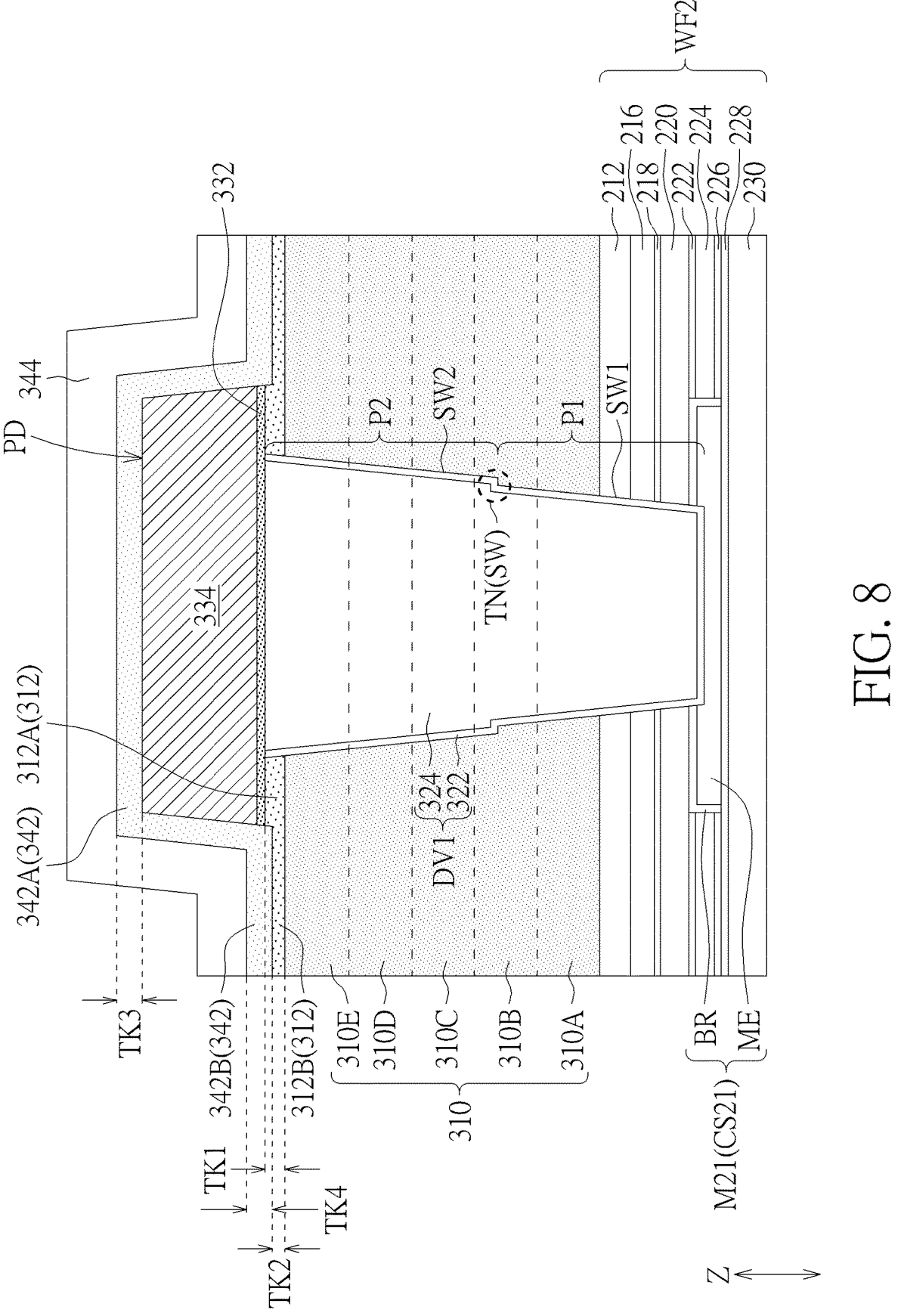

Please refer to FIGS. 3-8 and FIGS. 1-2. FIGS. 3-8 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 2 may be regarded as a schematic drawing in a step subsequent to FIG. 8. The manufacturing method in this embodiment may include the following steps. As shown in FIG. 1 and FIG. 2, the top wafer WF2 is bonded to the bottom wafer WF1, and the top wafer WF2 includes the interconnection structure CS21. The first dielectric layer 310 is formed on the top wafer WF2, and the second dielectric layer 312 is formed on the first dielectric layer 310. The deep via conductor structure DV1 is formed penetrates through the second dielectric layer 312 and the first dielectric layer 310, and the deep via conductor structure DV1 is connected with the interconnection structure CS21. The connection pad PD is formed on the second dielectric layer 312 and the deep via conductor structure DV1.

Specifically, the manufacturing method in this embodiment may include but is not limited to the following steps. As shown in FIG. 3, the first dielectric layer 310 may be formed on the back side of the top wafer WF2 (such as on the buried insulation layer 212), and the second dielectric layer 312 may be formed on the first dielectric layer 310. In some embodiments, because the integrated thickness of the first dielectric layer 310 is relatively great, a plurality of sub layers (such as the sub layer 310A, the sub layer 310B, the sub layer 310C, the sub layer 310D, and the sub layer 310E) may be formed by the film forming process with multiple sections, respectively, for controlling the thickness uniformity of the first dielectric layer 310, but not limited thereto. Subsequently, as shown in FIG. 4, a hole VH may be formed by an etching approach, and the hole VH may penetrate through the second dielectric layer 312, the first dielectric layer 310, the buried insulation layer 212, the isolation structure 216, the etching stop layer 218, and the dielectric layer 220 in the vertical direction Z for exposing a part of the interconnection structure CS21. In some embodiments, the hole VH may penetrate through the barrier layer BR in the conductive line M21 of the interconnection structure CS21, and the hole VH may expose the electrically conductive layer ME in the electrically conductive line M21 accordingly, but not limited thereto. In some embodiments, because of the influence of the material property difference between the sub layers in the first dielectric layer 310 and/or the etching steps configured to etch the first dielectric layer 310 separately, an inner sidewall IS of the hole VH may include a ladder shaped structure ST, and the ladder-shaped structure ST may be located in the sub layer of the first dielectric layer 310 or located at the interface between the sub layers. Subsequently, as shown in FIG. 4 and FIG. 5, the deep via conductor structure DV1 is formed in the hole VH, and the sidewall SW of the deep via conductor structure DV1 may include the turning section TN described above because of the influence of the inner sidewall IS of the hole VH. In some embodiments, the barrier layer 322 and the electrically conductive layer 324 may be partly formed in the hole VH and partly formed outside the hole VH, and the barrier layer 322 and the electrically conductive layer 324 located outside the hole VH may be removed by a planarization process (such as a chemical mechanical polishing process) for forming the deep via conductor structure DV1, but not limited thereto.

As shown in FIG. 6, after the step of forming the deep via conductor structure DV1, the barrier layer 332 and the electrically conductive layer 334 may be formed on the deep via conductor structure DV1 and the second dielectric layer 312. Subsequently, as shown in FIG. 6 and FIG. 7, the electrically conductive layer 334 and the barrier layer 332 may be patterned for forming the connection pad PD. In some embodiments, a part of the second dielectric layer 312 may be removed by the process of forming the connection pad PD (such as an etching process), and the thickness TK2 of the second portion 312B of the second dielectric layer 312 without being covered by the connection pad PD is less than the thickness TK1 of the first portion 312A of the second dielectric layer 312 covered by the connection pad PD accordingly. As shown in FIG. 8, after the step of forming the connection pad PD, the third dielectric layer 342 and the dielectric layer 344 may then be formed. The third dielectric layer 342 may be substantially formed conformally on the connection pad PD and the second dielectric layer 312, and the third dielectric layer 342 may directly contact the connection pad PD and the second portion 312B of the second dielectric layer 312. The third dielectric layer 342 may include the first portion 342A formed on the connection pad PD and a second portion 342B formed on the second portion 312B of the second dielectric layer 312, and the thickness TK3 of the first portion 342A may be substantially equal to the thickness TK4 of the second portion 342B, but not limited thereto. Subsequently, as shown in FIG. 2, the opening OP may be formed penetrating through the dielectric layer 344 and the third dielectric layer 342 located above the connection pad PD for exposing a part of the connection pad PD.

To summarize the above descriptions, according to the semiconductor device in the present invention, two wafers may be bonded to each other, the deep via conductor structure may be used to be connected with the interconnection structure in the wafer, and signals may be transmitted from outer circuits to elements in the wafers through the deep via conductor structure accordingly. In addition, by the disposition of the deep via conductor structure, the electrical connection path between an outer circuit and the elements in the top wafer and/or the bottom wafer may be provided from the back side of the top wafer. The negative influence of the structure connected to the outer circuit on the area occupied by the whole integrated circuit may be reduced, and the miniaturization requirements for related product may be met accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a bottom wafer;
a top wafer bonded to the bottom wafer, wherein the top wafer comprises a first interconnection structure;
a first dielectric layer disposed on the top wafer;
a second dielectric layer disposed on the first dielectric layer;
a deep via conductor structure penetrating through the second dielectric layer and the first dielectric layer, wherein the deep via conductor structure is connected with the first interconnection structure; and
a connection pad disposed on the second dielectric layer and the deep via conductor structure, wherein the second dielectric layer comprises:
a first portion sandwiched between the connection pad and the first dielectric layer; and
a second portion connected with the first portion, wherein a thickness of the second portion is less than a thickness of the first portion, the connection pad overlaps the first portion of the second dielectric layer in a vertical direction, and the second portion of the second dielectric layer is not covered by the connection pad in the vertical direction.

2. The semiconductor device according to claim 1, wherein a material composition of the second dielectric layer is different from a material composition of the first dielectric layer.

3. The semiconductor device according to claim 1, wherein the first dielectric layer is thicker than the second dielectric layer.

4. The semiconductor device according to claim 1, further comprising:
a third dielectric layer covering the connection pad and the second dielectric layer, wherein a sum of the thickness of the first portion of the second dielectric layer and a thickness of the third dielectric layer disposed on the connection pad is greater than a sum of the thickness of the second portion of the second dielectric layer and a thickness of the third dielectric layer disposed on the second dielectric layer.

5. The semiconductor device according to claim 4, wherein a material composition of the third dielectric layer is different from a material composition of the second dielectric layer.

6. The semiconductor device according to claim 4, wherein a material composition of the third dielectric layer is identical to a material composition of the second dielectric layer.

7. The semiconductor device according to claim 4, further comprising:
an opening penetrating through the third dielectric layer on the connection pad and exposing a part of the connection pad.

8. The semiconductor device according to claim 1, wherein the deep via conductor structure is directly connected with a portion of the first interconnection structure.

9. The semiconductor device according to claim 1, wherein the bottom wafer comprises a second interconnection structure, and the connection pad is electrically connected with the second interconnection structure via the deep via conductor structure and the first interconnection structure of the top wafer.

10. A semiconductor device, comprising:
a bottom wafer;
a top wafer bonded to the bottom wafer, wherein the top wafer comprises a first interconnection structure and a buried insulation layer;
a first dielectric layer disposed on the top wafer, wherein the buried insulation layer is disposed between the first interconnection structure and the first dielectric layer; and
a deep via conductor structure penetrating through the first dielectric layer and the buried insulation layer, wherein the deep via conductor structure is connected with the first interconnection structure, and the deep via conductor structure comprises:
a first portion; and
a second portion connected with the first portion, wherein the first portion is sandwiched between the second portion and the first interconnection structure, and a sidewall of the deep via conductor structure comprises a turning section located between a sidewall of the first portion and a sidewall of the second portion,
wherein a material composition of the first dielectric layer is different from a material composition of the buried insulation layer, and the first dielectric layer is thicker than the buried insulation layer.

11. The semiconductor device according to claim 10, wherein the turning section of the sidewall of the deep via conductor structure is located in the first dielectric layer.

12. The semiconductor device according to claim 10, wherein the turning section of the sidewall of the deep via conductor structure is directly connected with the sidewall of the first portion and the sidewall of the second portion.

13. The semiconductor device according to claim 10, wherein a width of the first portion is less than a width of the second portion.

14. The semiconductor device according to claim 10, further comprising:
a connection pad disposed on the deep via conductor structure; and
a second dielectric layer disposed between the first dielectric layer and the connection pad, wherein the deep via conductor structure further penetrates through the second dielectric layer.

15. The semiconductor device according to claim 14, wherein a material composition of the first dielectric layer is different from a material composition of the second dielectric layer, and the first dielectric layer is thicker than the second dielectric layer.

16. The semiconductor device according to claim 14, wherein the bottom wafer comprises a second interconnection structure, and the connection pad is electrically connected with the second interconnection structure via the deep via conductor structure and the first interconnection structure of the top wafer.

17. The semiconductor device according to claim 10, wherein the deep via conductor structure is directly connected with a portion of the first interconnection structure.

* * * * *